United States Patent
Sung

(10) Patent No.: US 7,348,272 B2
(45) Date of Patent: Mar. 25, 2008

(54) METHOD OF FABRICATING INTERCONNECT

(75) Inventor: Shu-Jen Sung, Yilan (TW)

(73) Assignee: United Microelectronics Corp., Hsinchu (TW)

( * ) Notice: Subject to any disclaimer, the term of this patent is extended or adjusted under 35 U.S.C. 154(b) by 203 days.

(21) Appl. No.: 11/161,431

(22) Filed: Aug. 3, 2005

(65) Prior Publication Data

US 2007/0032058 A1    Feb. 8, 2007

(51) Int. Cl.
*H01L 21/44* (2006.01)
(52) U.S. Cl. .............. 438/624; 438/597; 438/626; 438/631; 438/633; 257/21.476
(58) Field of Classification Search ........... 438/624, 438/633, 597
See application file for complete search history.

(56) References Cited

U.S. PATENT DOCUMENTS

| 6,413,854 | B1 | 7/2002 | Uzoh et al. | 438/637 |
|---|---|---|---|---|
| 6,541,372 | B2 * | 4/2003 | Wege et al. | 438/633 |
| 6,551,924 | B1 | 4/2003 | Dalton et al. | 438/637 |
| 6,573,606 | B2 * | 6/2003 | Sambucetti et al. | 257/762 |
| 6,583,043 | B2 * | 6/2003 | Shroff et al. | 438/618 |
| 6,969,911 | B2 * | 11/2005 | Abe | 257/751 |
| 6,992,005 | B2 * | 1/2006 | Ohtsuka et al. | 438/685 |
| 7,199,045 | B2 * | 4/2007 | Liu et al. | 438/629 |
| 2005/0130407 | A1 * | 6/2005 | Tu | 438/631 |
| 2007/0057374 | A1 * | 3/2007 | McLaughlin et al. | 257/751 |

OTHER PUBLICATIONS

Article titled "*Successful Dual Damascene Integration of Extreme Low k Materials (k<2.0) Using a Novel Gap Fill Based Integration Scheme*" jointly authored by S. Nitta et al., IEEE Electron Device Letters, pp. 321-324.

* cited by examiner

*Primary Examiner*—Michael Lebentritt
*Assistant Examiner*—Angel Roman
(74) *Attorney, Agent, or Firm*—Jianq Chyun IP Office

(57) ABSTRACT

A method of fabricating interconnect is described. A first dielectric layer having an opening is formed over a substrate. A metal layer is filled into the opening. A material layer is formed over the first dielectric layer and the metal layer. A surface treatment process is performed to the material layer so as to form a cap layer on the surface of the metal layer. The material layer and a portion of the first dielectric layer are removed. A second dielectric layer is formed over the substrate, and the surface of the second dielectric layer is higher than that of the cap layer. A planarization process is performed at least to remove a portion of the second dielectric layer and a portion of the cap layer so as to expose the top of the opening.

18 Claims, 3 Drawing Sheets

METHOD OF FABRICATING INTERCONNECT

BACKGROUND OF THE INVENTION

1. Field of the Invention

The present invention relates to a semiconductor process, and more particularly, to a method of fabricating interconnect.

2. Description of the Related Art

With the advance of semiconductor technology, the surface of a chip cannot provide sufficient area for fabricating a metal interconnect due to the device minimization and high integration density. In order to satisfy the area requirement of the metal interconnect after the device minimization, a multiple metal layer design has been developed.

In the prior art interconnect process, a dielectric layer is formed over the substrate with devices thereon. The dielectric layer can be, for example, a silicon oxide layer. An anisotropic etch process then is performed to form an opening in the dielectric layer. The bottom of the opening exposes a portion of the device or a portion of the dielectric layer, for example. A copper metal layer is formed over the substrate to fill the opening. An etch-back process, such as a chemical-mechanical polish (CMP), is performed to remove a portion of the copper metal layer so as to expose the surface of the dielectric layer.

However, there are some issues related to the interconnect process and structure. For example, the etch process described above not only planarizes the copper metal layer, but also removes a portion of the dielectric layer. That causes the damage to the surface of the dielectric layer. In addition, due to the surface damage of the dielectric layer, seams are likely formed in the subsequent dielectric barrier layer that affects process reliability.

In order to overcome the issues described above, in a prior art method of fabricating interconnect, an etch-back process is performed to the dielectric layer after the formation of the interconnect structure. The etch-back process removes the damaged surface of the dielectric layer. A low-k dielectric layer then is deposited. Another etch-back process is performed to the low-k dielectric layer. This method can diminish the surface damage of the dielectric layer and reduce the impact to the subsequent process. During the etch-back process to the dielectric layer, the surface of the copper metal layer, however, is damaged.

U.S. Pat. No. 6,413,854B1 discloses a method of fabricating a multi-layer structure. A material layer is formed on a metal layer of an interconnect structure by an electroless plating process. The surface of the metal layer, which is subject to the damage in the subsequent etch process to the dielectric layer, can be protected. U.S. Pat. No. 6,551,924B1 discloses an etch process of a dielectric layer after a metallization process. A protection layer is formed on the metal layer by a plasma etch process. In addition, a portion of the dielectric layer is etched as well. "Successful Dual Damascene Integration of Extreme Low k Materials (k<2.0) Using a Novel Gap Fill Based Integration Scheme", published in IEEE IEDM, S. Nitta et al., 2004, discloses a method of fabricating an interconnect with the etch-back/gap-fill (EBGF) process to a dielectric layer. While a CMP process planarizes a refilled dielectric layer, a cap layer is formed on the metal layer to protect the surface of the metal layer from damage.

SUMMARY OF THE INVENTION

Accordingly, the present invention is directed to a method of fabricating interconnect. The method prevents the issue of damaged surface of the metal layer which may affect the process reliability. In addition, the method enhances the process reliability by forming a dielectric layer with a better film quality.

The present invention provides a method of fabricating interconnect. In the method, a first dielectric layer is formed over a substrate, and an opening is formed in the first dielectric layer. A metal layer is formed to fill the opening. A material layer is formed over the first dielectric layer and the metal layer. A surface treatment process is performed to the material layer to form a cap layer over a surface of the metal layer. Next, the material layer and a portion of the first dielectric layer are removed. A second dielectric layer is formed over the substrate, and a surface of the second dielectric layer is higher than a surface of the cap layer. A planarization process is performed at least to remove a portion of the second dielectric layer and a portion of the cap layer so as to expose a top of the opening.

According to the embodiment of the present invention, the material layer described above can be, for example, a metal material layer or a semiconductor material layer. Wherein, the material of the metal material layer can be, for example, aluminum (Al), titanium (Ti), tungsten (W), cobalt (Co), nickel (Ni), ruthenium (Ru), zirconium (Zr), tin (Sn), zinc (Zn), or the combination thereof. The material of the semiconductor material layer can be, for example, silicon (Si), germanium (Ge) or the combination thereof.

According to the embodiment of the present invention, the surface treatment process described above can be, for example, a thermal annealing process. The temperature of the thermal annealing process is from about 100° C. to about 500° C. In addition, the surface treatment process uses a plasma gas, for example. The plasma gas is selected from a group consisting of oxygen ($O_2$), nitrous oxide ($N_2O$), carbon dioxide ($CO_2$), ammonia ($NH_3$) or the combination thereof.

According to the embodiment of the present invention, the second dielectric layer described above can be, for example, a low-k dielectric layer. Wherein, the material of the low-k dielectric layer comprises fluorine doped silicate glass (FSG) or silicon oxycarbide (SiOC). Additionally, the method of forming the second dielectric layer comprises, for example, a plasma enhanced chemical vapor deposition (PECVD) method or a spin-on method.

According to the embodiment of the present invention, the method of removing the material layer described above comprises an etch process, for example.

According to the embodiment of the present invention, the method of removing the portion of the first dielectric layer described above can be, for example, an etch process.

According to the embodiment of the present invention, the planarization process described above comprises a chemical-mechanical polish (CMP) process or an etch-back process.

According to the embodiment of the present invention, after exposing the top of the opening, further comprises the step of the performing the planarization process is proceeded to expose the surface of the metal layer.

According to the embodiment of the present invention, the material of the metal layer described above can be, for example, copper.

According to the embodiment of the present invention, a barrier layer is formed on the surface of the opening. A material of the barrier layer layer described above can be, for example, tantalum (Ta), or tantalum nitride (TaN).

In the present invention, a cap layer is formed over the metal layer so that the surface of the metal layer is not subject to damage during the planarization process for the dielectric layer. The process reliability thus is enhanced. Additionally, in the present invention a well-known semiconductor process, such as a thermal annealing process, is used to form the cap layer over the metal layer. Without a photolithographic process in the present invention, the cap layer is self-align formed so that the surface of the metal layer can be protected.

The above and other features of the present invention will be better understood from the following detailed description of the preferred embodiments of the invention that is provided in communication with the accompanying drawings.

DESCRIPTION OF SOME EMBODIMENTS

FIGS. 1A-1F are schematic cross sectional views showing progress of a method of forming interconnect according to an embodiment of the present invention.

Figure 1A:
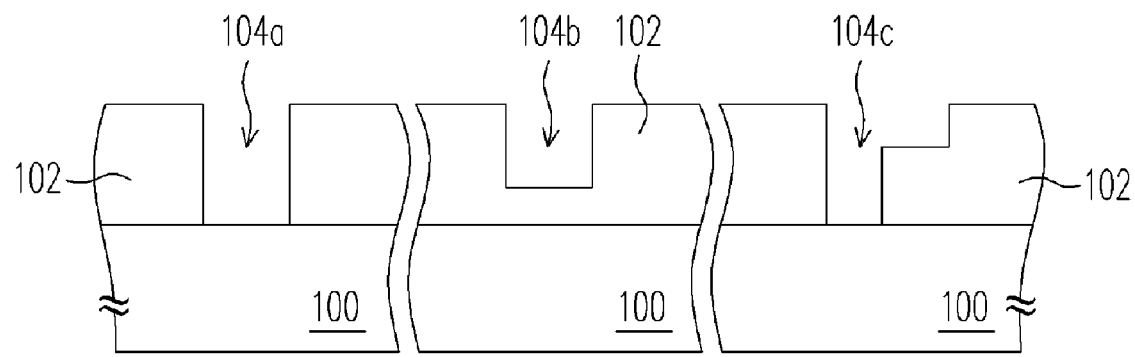
FIGS. 1A-1F are schematic cross sectional views showing a flowchart of forming interconnect according to an embodiment of the present invention.

Referring to FIG. 1A, a substrate 100 is provided. Some devices (not shown) are formed over the substrate 100. A dielectric layer 102 then is formed over the substrate 100. The material of the dielectric layer 102 can be, for example, silicon oxide. The method of forming the dielectric layer 102 can be a chemical vapor deposition (CVD) method, for example. Additionally, the dielectric layer 102 described above can be composed of a single, or multiple dielectric layers. Adjustment can be made depending on the circuit design requirement.

Then, an opening is formed in the dielectric layer 102. A conductive material can be filled in the opening in the subsequent process, serving as interconnect. In this embodiment, the openings are represented by the reference numbers 104a-104c. The present invention, however, is not limited thereto. Wherein, the method of forming the opening 104a-104c can comprise, for example, a photolithographic process and an etch process. Additionally, the bottom of the opening exposes a portion of devices or a portion of the dielectric layer 102. The opening 104a-104c can be, for example, a damascene opening, a contact opening, a via opening or a trench.

Figure 1B:
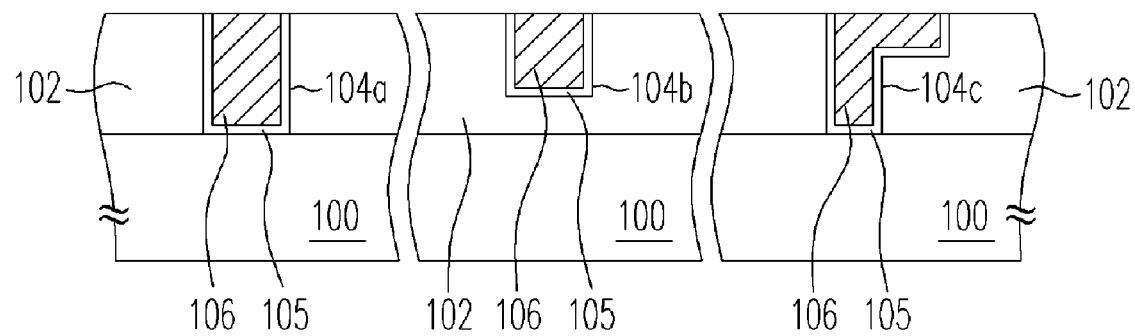

Referring to FIG. 1B, a metal layer 106 is formed to fill the opening 104a-104c. Wherein, the material of the metal layer 106 can be, for example, copper. In the method of forming the metal layer 106, a metal material layer is deposited over the substrate 100, and then a portion of the metal material layer is removed to expose the surface of the dielectric layer 102 by a chemical-mechanical polish (CMP) process, for example. In an embodiment, a barrier layer 105 can be formed over the surface of the opening 104a-104c to avoid the interaction resulting from the direct contact of the subsequent metal layer 106 and the dielectric layer 102. The material of the barrier layer 105 can be, for example, tantalum (Ta) or tantalum nitride (TaN). During the described CMP process to the metal material layer, though the metal material layer is planarized, the surface of the dielectric layer 102 is nevertheless damaged. Thus, the process reliability is affected.

Figure 1C:
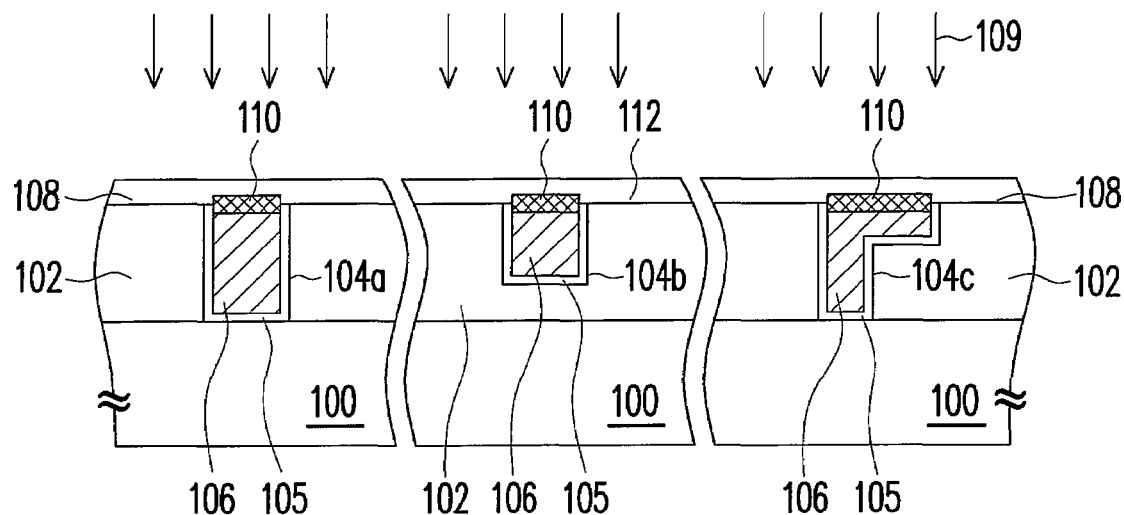

Referring to FIG. 1C, a material layer 108 is formed over the substrate 100, covering the dielectric layer 102, the metal layer 106 and the barrier layer 105. Wherein, the material layer 108 comprises a metal material layer or a semiconductor material layer. The material of the metal material layer can be, for example, aluminum (Al), titanium (Ti), tungsten (W), cobalt (Co), nickel (Ni), ruthenium (Ru), zirconium (Zr), tin (Sn), zinc (Zn), or the combination thereof. The material of the semiconductor material layer can be, for example, silicon (Si), germanium (Ge) or the combination thereof.

Then, a surface treatment process 109 is performed to the material layer 108 so as to form a cap layer 110 on the surface of the metal layer 106. The surface treatment process 109 can be, for example, a thermal annealing process. The temperature of the thermal annealing process is from about 100° C. to about 500° C. The surface treatment process 109 uses a plasma gas, for example. The plasma gas is selected from a group consisting of oxygen ($O_2$), nitrous oxide ($N_2O$), carbon dioxide ($CO_2$), ammonia ($NH_3$) or the combination thereof. In other words, in the step of forming the cap layer 110, the surface treatment process 109 is performed to the material layer 108 so that the material layer 108 interacts with the metal layer 106, for example. Accordingly, a metal alloy material layer, serving as the cap layer 110, is self-align formed on the surface of the metal layer 106.

Note that in the step of forming the cap layer 110 on the metal layer 106, an electroless plating method or a plasma etch method is not required. Moreover, in the present invention, the cap layer 110 can be formed by a well-known semiconductor process, such as a thermal annealing process, so to protect the metal layer 106.

Figure 1D:
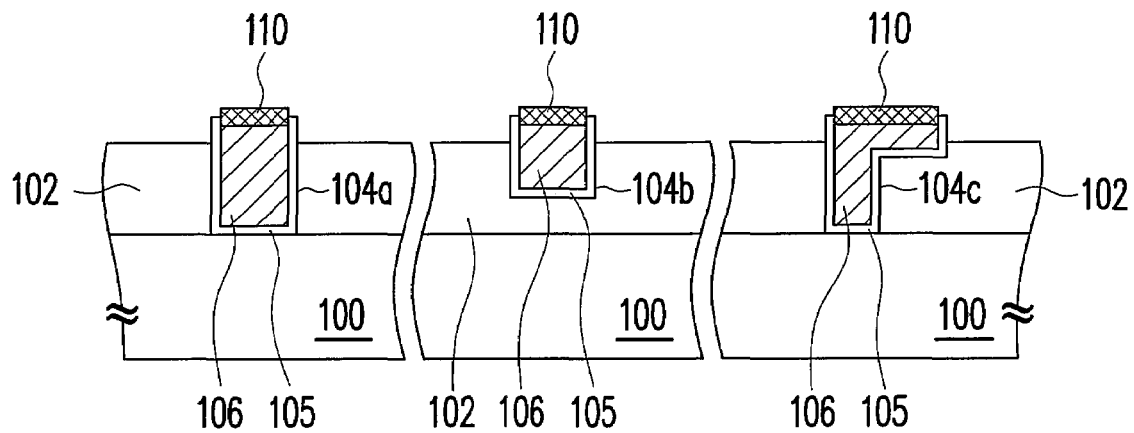

Referring to FIG. 1D, a portion of the material layer 108 and a portion of dielectric layer 102 are removed. Wherein, the method of removing the portion of the material layer 108 can be, for example, an etch process. The etch process can be, for example, an isotropic etch process or an anisotropic etch process, or a method comprising alternately performing an isotropic etch process and an anisotropic etch process. The method of removing the portion of the dielectric layer 102 can be, for example, an etch process. The etch process can be, for example, an isotropic etch process or an anisotropic etch process, or a method comprising alternately performing an isotropic etch process and an anisotropic etch process. The step of removing the portion of the dielectric layer 102 described above at least removes the damaged portion on the surface of the dielectric layer 102. In an embodiment, the step of removing the portion of the dielectric layer 102 further removes the dielectric layer 102, which is not covered by the barrier layer 105 and the metal layer 106.

Figure 1E:
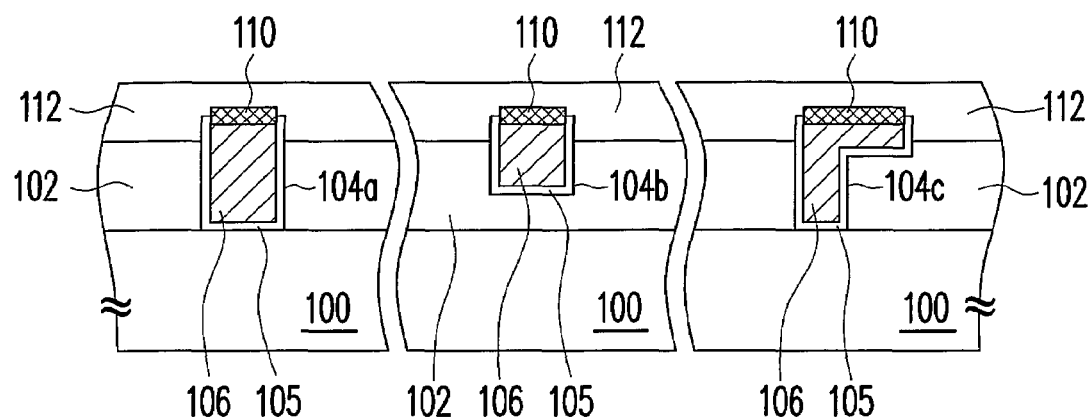

Referring to FIG. 1E, a dielectric layer 112 is formed over the substrate 102, and the surface of the dielectric layer 112 is higher than that of the cap layer 110. Wherein, the method of forming the dielectric layer 112 can be, for example, a plasma enhanced chemical vapor deposition (PECVD) method or a spin-on method. The dielectric layer 112 can be, for example, a low-k dielectric layer. Its dielectric constant is from about 1 to about 3. The material of the low-k dielectric layer can be, for example, fluorine doped silicate glass (FSG) or silicon oxycarbide (SiOC).

Figure 1F:
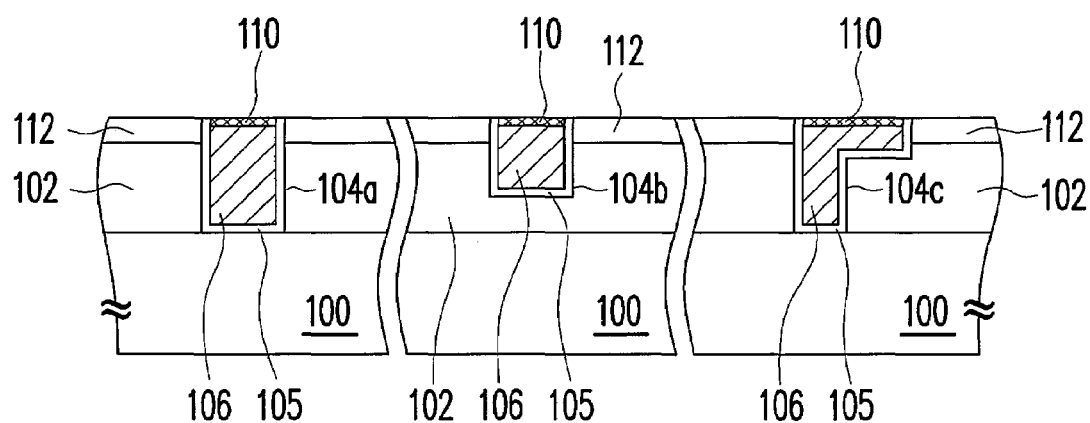

Referring to FIG. 1F, a planarization process is performed at least to remove a portion of the dielectric layer 112 and a portion of the cap layer 110 so as to expose the top of the opening 104a-104c. The planarization process described above can be, for example, a chemical-mechanical polish (CMP) method or an etch-back process. In an embodiment, while the dielectric layer 112 is planarized, after exposing the top of the opening 104a-104c, further comprises the step of the performing the planarization process is proceeded to expose the surface of the metal layer 106. Since the cap layer 110 is formed on the metal layer 106, the cap layer 110 protects the metal layer 106 during the planarization process to the dielectric layer 112. The issue of surface damage of the metal layer 106 can be eliminated, and the subsequent process thus is not affected.

Accordingly, the present invention comprises the following advantages.

1. By the method of the present invention, not only can the dielectric layer with the better film quality be formed, but the surface damage of the metal layer can be avoided while the refilled dielectric layer is planarized. The process reliability thus is not affected.

2. In the present invention, the well-known semiconductor process is used to form the cap layer on the metal layer to prevent the surface of the metal layer from damage. The process reliability also is increased.

3. Without the prior art electroless plating or plasma etch method, the surface of the metal layer can be protected according to the present invention.

4. In the method of the present invention, a photolithographic process is not required, and the cap layer can be self-align formed on the cap layer to protect the surface of the metal layer. The manufacturing costs are decreased, and the process reliability is enhanced.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. A method of fabricating interconnects, comprising:
    forming a first dielectric layer over a substrate, and forming an opening in the first dielectric layer;
    forming a metal layer filling the opening;
    forming a material layer over the first dielectric layer and the metal layer;
    performing a surface treatment process to the material layer, so that the metal layer interacting with the material layer to form a cap layer over a surface of the metal layer;
    removing the material layer completely and a portion of the first dielectric layer;
    forming a second dielectric layer over the substrate, a surface of the second dielectric layer being higher than a surface of the cap layer; and
    performing a planarization process at least to remove a portion of the second dielectric layer and a portion of the cap layer so as to expose a top of the opening.

2. The method of fabricating interconnects of claim 1, wherein the material layer comprises a metal material layer or a semiconductor material layer.

3. The method of fabricating interconnects of claim 2, wherein a material of the metal material layer comprises aluminum (Al), titanium (Ti), tungsten (W), cobalt (Co), nickel (Ni), ruthenium (Ru), zirconium (Zr), tin (Sn), zinc (Zn), or the combination thereof.

4. The method of fabricating interconnects of claim 2, wherein a material of the semiconductor material layer comprises silicon (Si), germanium (Ge) or the combination thereof.

5. The method of fabricating interconnects of claim 1, wherein the surface treatment process comprises a thermal annealing process.

6. The method of fabricating interconnects of claim 5, wherein a temperature of the thermal annealing process is from about 100° C. to about 500° C.

7. The method of fabricating interconnects of claim 1, wherein the surface treatment process comprises using a plasma gas.

8. The method of fabricating interconnects of claim 7, wherein the plasma gas is selected from a group consisting of oxygen ($O_2$), nitrous oxide ($N_2O$), carbon dioxide ($CO_2$), ammonia ($NH_3$) or the combination thereof.

9. The method of fabricating interconnects of claim 1, wherein the second dielectric layer comprises a low-k dielectric layer.

10. The method of fabricating interconnects of claim 9, wherein a material of the low-k dielectric layer comprises fluorine doped silicate glass (FSG) or silicon oxycarbide (SiOC).

11. The method of fabricating interconnects of claim 1, wherein a method of forming the second dielectric layer comprises a plasma enhanced chemical vapor deposition (PECVD) method or a spin-on method.

12. The method of fabricating interconnects of claim 1, wherein a method of removing the material layer comprises an etch process.

13. The method of fabricating interconnects of claim 1, wherein a method of removing the portion of the first dielectric layer comprises an etch process.

14. The method of fabricating interconnects of claim 1, wherein the planarization process comprises a chemical-mechanical polish (CMP) process or an etch-back process.

15. The method of fabricating interconnects of claim 1, wherein the step of the performing the planarization process is proceeded to expose the surface of the metal layer after exposing the top of the opening.

16. The method of fabricating interconnects of claim 1, wherein a material of the metal layer comprises copper.

17. The method of fabricating interconnects of claim 1, further comprises a barrier layer is formed on the surface of the opening.

18. The method of fabricating interconnects of claim 17, wherein a material of the barrier layer comprises a tantalum (Ta), or a tantalum nitride (TaN).

* * * * *